United States Patent [19]

Bylander et al.

[11] 3,794,883

[45] Feb. 26, 1974

[54] PROCESS FOR FABRICATING GE:HG INFRARED DETECTOR ARRAYS AND RESULTING ARTICLE OF MANUFACTURE

[76] Inventors: Ernest G. Bylander, Ervay, Dallas, Tex. 75201; Hall E. Jarman, 555 Brookhurst, Dallas, Tex. 75218

[22] Filed: Feb. 1, 1973

[21] Appl. No.: 328,552

Related U.S. Application Data

[63] Continuation of Ser. No. 32,490, April 13, 1970, abandoned.

[52] U.S. Cl. ..... 317/234 R, 317/234 A, 317/234 L, 317/234 M, 317/234 N, 317/235 N, 317/235 D, 317/235 AM

[51] Int. Cl. .......... H01l 15/00

[58] Field of Search...317/235 N, 235 AM, 234 L, 317/234 M, 234 N, 234 A

[56] References Cited

UNITED STATES PATENTS

| | | | |
|---|---|---|---|
| 3,369,290 | 2/1968 | Mayer | 29/581 |
| 3,383,760 | 5/1968 | Schwartzman | 29/577 |
| 3,484,713 | 12/1969 | Fenner | 331/94.5 |
| 3,275,557 | 9/1966 | Hughes | 252/62.3 |

*Primary Examiner*—Martin H. Edlow

*Attorney, Agent, or Firm*—James O. Dixon; Harold Levine; Andrew M. Hassell

[57] ABSTRACT

An infrared detector array is fabricated by alloying a slice of mercury doped germanium to a degenerate germanium substrate. After being lapped to the desired thickness, the slice is etched through to the substrate to form individual detector bars using a metal mask which is then partially removed to form a gold contact strip on each bar. Output conductors are formed by patterning copper films thermocompression bonded to high temperature plastics, gold plating the conductors, and connecting the gold plated conductors to the gold contact strips by gold jumper wires thermocompression bonded to the conductors and to the contact strips.

8 Claims, 22 Drawing Figures

INVENTORS

ERNEST G. BYLANDER
HALL E. JARMAN

INVENTORS
ERNEST G. BYLANDER
HALL E. JARMAN

INVENTORS

ERNEST G. BYLANDER
HALL E. JARMAN

INVENTORS

ERNEST G. BYLANDER
HALL E. JARMAN

PROCESS FOR FABRICATING GE:HG INFRARED DETECTOR ARRAYS AND RESULTING ARTICLE OF MANUFACTURE

This is a continuation, of application Ser. No. 32,490, filed Apr. 13, 1970, now abandoned.

This invention relates generally to infrared detectors, and more particularly relates to infrared detector arrays having a large number of very small detectors.

Infrared detector systems are presently being fabricated for use in the 8–14 micron region which employ up to one hundred mercury doped germanium detector elements mounted in a linear array. Each element has a generally square cross section on the order of from 0.010 to 0.030 inch on a side, and is normally fabricated by separating a wafer into separate bars, then mounting each bar on a substrate. This procedure results in a practical limit to the minimum size bar which can be fabricated, primarily because of the problems inherent in handling very small elements. Further, the expense of an array fabricated in this manner is almost directly related to the number of elements in the system, making systems having a large number of arrays very expensive.

Advanced infrared systems require very large numbers of detectors, typically one thousand, in order to meet operational requirements. Since most of these systems are airborne, the individual detector elements must be very small in order to reduce the overall system dimensions and weight. The detector elements should be as small as possible within the limits imposed by resolution requirements.

This invention is concerned with a process for fabricating an array of a large number of infrared detectors wherein each detector may be substantially as small as desired, for example, having a square cross section 0.002 inch on a side. A subarray, typically having 200 detector elements, is fabricated by a process which lends itself to mass production, thus greatly reducing the cost of a system having a large number of detector elements.

In accordance with this invention, the infrared detector array is fabricated by alloying a slice of semiconductor detector material to a substrate, then chemically etching selected areas of the slice to divide the slice into a plurality of separate detector elements. In a preferred embodiment, the substrate is a degenerate form of the same semiconductor material used for the detectors which provides a process carrier for the slice that has a matched thermal coefficient of expansion for stress relief during temperature cycling as well as high electrical and thermal conductivity. More particularly, the detector material is mercury doped germanium and the substrate is gallium or arsenic doped germanium.

In accordance with a specific aspect of the invention, the slice of detector material is etched into bars using a metal mask having etching slots substantially narrower than the ultimate width of the etched groove. As the detector material is etched through the slots, the edges of the metal mask overhanging the etch groove is repeatedly bent down over the side walls of the groove to slow the etch rate of the side walls and achieve a relatively high depth to width etch ratio. The resulting detector bars have a substantially square cross section and are separated by grooves of about the same width.

In accordance with another aspect of the invention, multiple metal layers are used to form the etch mask to provide a metal contact strip on each detector bar and to improve adhesion of the contact strip to the metal bar.

The invention also contemplates a process for electrically connecting the very small individual contact strips to larger solder pads for easy connection to outside circuitry by patterning a copper film thermocompression bonded to a thin flexible sheet of high temperature plastic, gold plating the patterned copper film, and then interconnecting the metal contact strips on the individual bars and the conductors either by gold jumper wires or by direct thermocompression bonds between the contact strips and the conductors.

In accordance with still another aspect of the invention, two arrays are juxtaposed in staggered relationship to effectively provide a continuous line of elements for incorporation in a scanning system.

Various aspects of the array produced by the process are also claimed.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
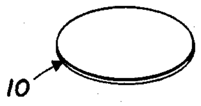
FIG. 1 is a perspective view of a slice of infrared detector material used to fabricate a detector array in accordance with the present invention.

Referring now to the drawings, a slice of infrared semiconductor detector material is indicated generally by the reference numeral 10 in FIG. 1. The slice 10 is typically about one inch in diameter and about 0.010 inch thick, and is germanium doped with mercury in a manner known in the art.

Figure 2:
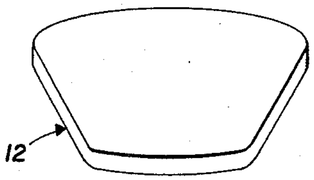
FIG. 2 is a perspective view of the substrate used to fabricate the detector array in accordance with the present invention.

A high conductivity substrate is indicated generally by the reference numeral 12 in FIG. 2. The substrate 12 is a degenerate form of the same semiconductor material as the slice 10, and is preferably germanium doped with gallium to a level such that the germanium is degenerate and has a resistance of about 0.0007 ohm-centimeter. Both the slice 10 and the substrate 12 are preferably cut along the (111) plane.

Figure 3:
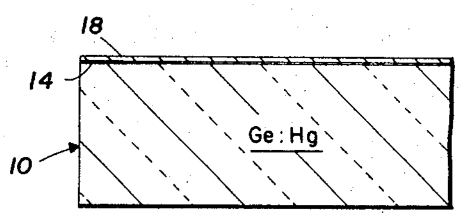
FIGS. 3–5 are somewhat schematic sectional views illustrating the manner in which the slice of FIG. 1 is alloyed to the substrate of FIG. 2.
Figure 4:
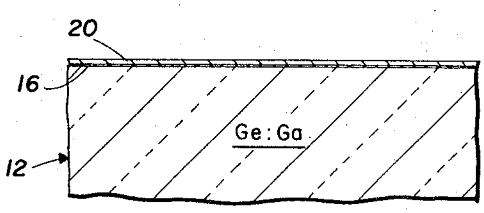
Figure 5:
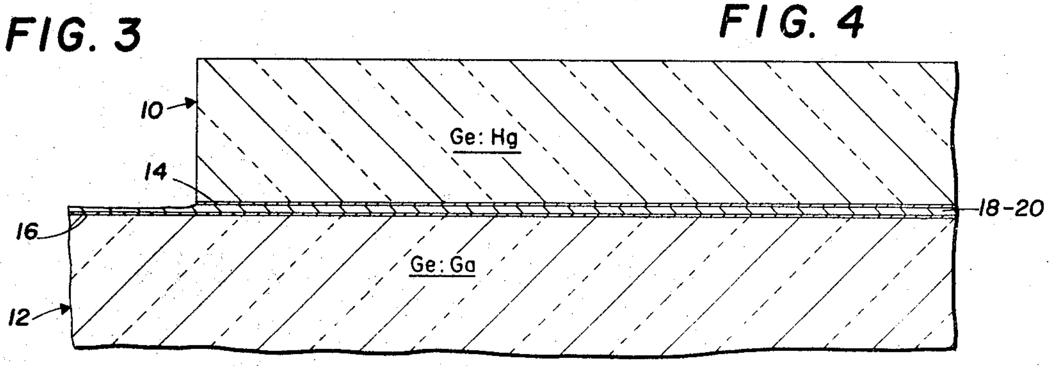

One surface of the slice 10 and one surface of the substrate 12 are mechanically-chemically lapped and polished using a Clorox-water polishing solution. After the surfaces are highly polished, the surfaces are degreased with a commercial solvent and dried in an oven. The slice 10 and substrate 12 are then placed in a vacuum evaporator and a thin layer 14 of chromium deposited on the polished surface of the slice 10, and a thin layer 16 of chromium deposited on the polished surface of the substrate 12, as illustrated in FIGS. 3 and 4. Then a thicker layer 18 of gold is vacuum deposited on the chromium layer 14 and a thicker layer 20 of gold deposited on the chromium layer 16. The depositions of the chromium layers 14 and 16 and the gold layers 18 and 20 are both carried out with the slice 10 and substrate 12 at a temperature of about 150° C. The purpose of the chromium layers 14 and 16 is to more adherently bond the gold layers 18 and 20 to the slice 10 and substrate 12, respectively. Next, the slice 10 is inverted and placed on the substrate 12 with the gold layer 18 in contact with the gold layer 20. A weight is placed on the slice 10, and the sandwich placed in an oven, and heated to about 425° C to melt the gold, then slow cooled to about 200° C over a period of 5 or 6 minutes to alloy the slice 10 to the substrate 12 as illustrated in FIG. 5.

If desired, the slice 10 may be alloyed to the substrate 12 by first coating the polished surfaces with gold plate from an acid plating solution for a period of about two minutes, then placing a thin preform comprised of about 88 percent gold and 12 percent germanium between the gold plated surfaces. The sandwich is then heated to about 360° C while inducing a slight scrubbing action, then maintained under pressure until cooled below about 356° C where the alloy completely solidifies.

After the slice 10 has been alloyed to the substrate 12, the exposed surface of the slice 10 is lapped and polished using a water-Clorox solution in a mechanical-chemical lapping apparatus. The mercury doped germanium is lapped at a rate of about 0.001 inch per hour, thus providing a means for closely controlling the ultimate thickness of the mercury doped germanium slice 10. The slice 10 is lapped until it has a thickness corresponding to the ultimate dimensions desired for the individual infrared detector elements. Thus, if each element is to be 0.002 inch square, for example, the slice 10 is lapped until it is 0.002 inch thick. The substrate 12 and slice 10 are then degreased and baked out in the conventional manner to remove impurities.

Figure 6:
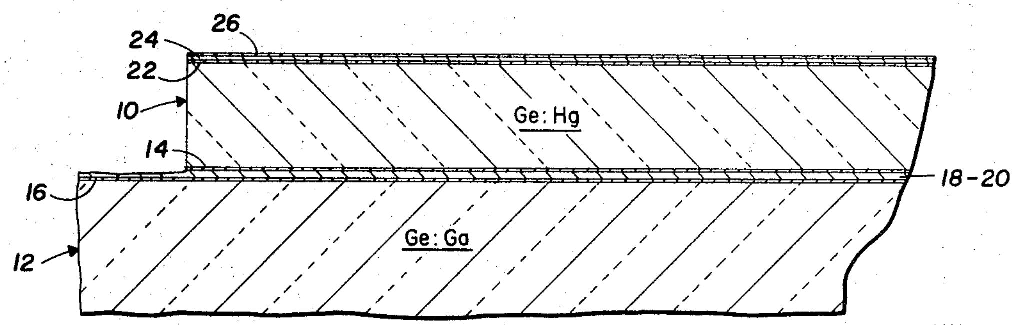
FIGS. 6–17 are somewhat schematic sectional views illustrating the manner in which the slice of detector material is masked and etched in accordance with the present invention.

Next, the substrate 12 and slice 10 are placed in an evaporator and a thin layer 22 of chromium vacuum deposited on the polished surface of the mercury doped germanium slice 10 followed by a thicker layer 24 of gold, as illustrated in FIG. 6. These two layers are deposited with the slice 10 at about 150° C. The purpose of the chromium layer 22 is to adherently bond the gold layer 24 to the germanium slice 10. The gold layer 24 will first serve the function of an etching mask, and ultimately the function of an electrical contact. The slice 10 is then cooled to room temperature and a second relatively thin chromium layer 26 vacuum deposited on the gold layer 24. The second chromium layer 26 is deposited at room temperature because its sole purpose is to serve as an etching mask for the gold layer 24, and it will ultimately be removed as will hereafter be described.

Figure 7:
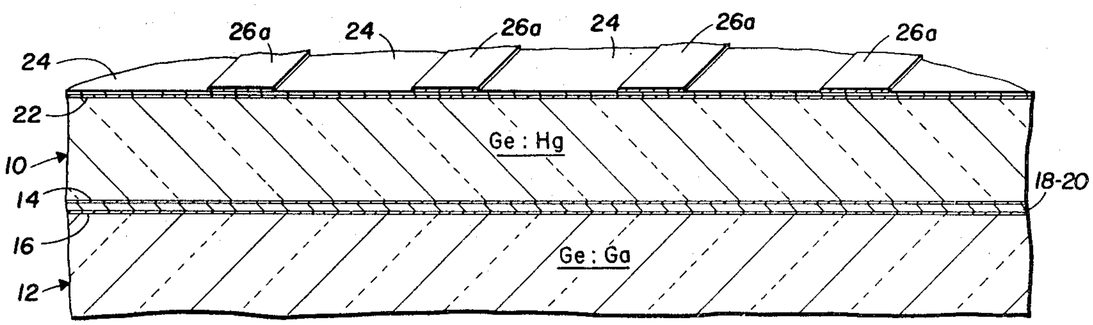

Next, the second chromium layer 26 is patterned using a conventional photolithographic technique to leave strips 26*a*, as shown in FIG. 7. This is achieved by using a standard photoresist such as KMER to mask the chromium strips 26*a*, and a 1:1 solution of hydrochloric acid and methyl alcohol which selectively etches the chromium in preference to the underlying gold layer 24. Zinc dust is sprinkled on the chromium to activate the etching process. Gold layer 24 protects the first chromium layer 22. If the ultimate dimension of the infrared detector elements is to be 0.002 by 0.002 inch, then the chromium strips 26*a* extend in parallel relationship across the entire slice, are spaced on 0.004 centers, or the desired centers of the individual detector elements, and are about 0.0015 inch wide.

Figure 8:
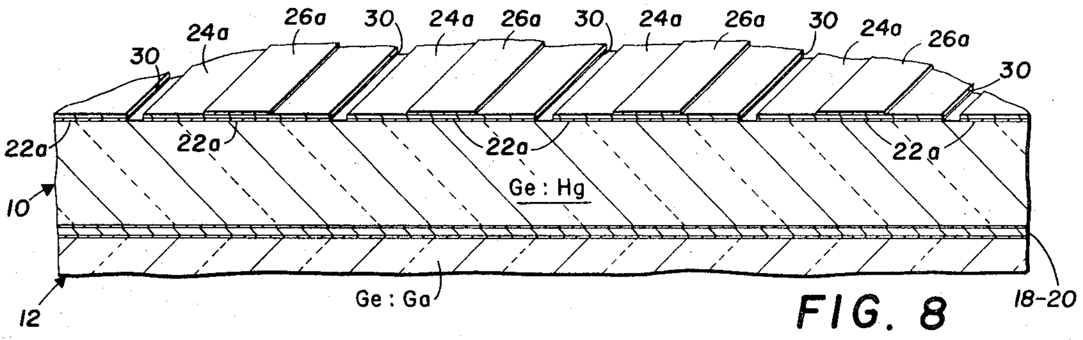

Next, the gold layer 24 and the first chromium layer 22 are selectively removed to leave gold strips 24*a* and form slots 30 which expose the underlying mercury doped germanium slice 10, as shown in FIG. 8. This is achieved using a photolithographic technique in which the chromium strips 26*a* and the gold layer 24 are protected by a photo-resist, such as KMER, and the gold is selectively removed using a potassium, iodide and water solution having excess iodide, and the chromium removed by the hydrochloric acid and methyl alcohol solution previously mentioned. After the slots 30 are formed, the photo-resist is removed.

Next, the substrate 12 is mounted on a suitable holder, such as by waxing the bottom of the substrate 12 and pressing the wax against a gold plate. The slice 10 is then disposed in inverted position in an upwardly directed geyser of a suitable etching liquid for the germanium, such as hydrofluoric acid. The etching rate of the germanium in the hydrofluoric acid is about 0.0005 inch per minute. The hydrofluoric acid is ineffectual against either the chromium strips 26*a* or the gold strips 24*a*, and thus etches only the portion of the germanium slice 10 exposed through slots 30.

Figure 9:
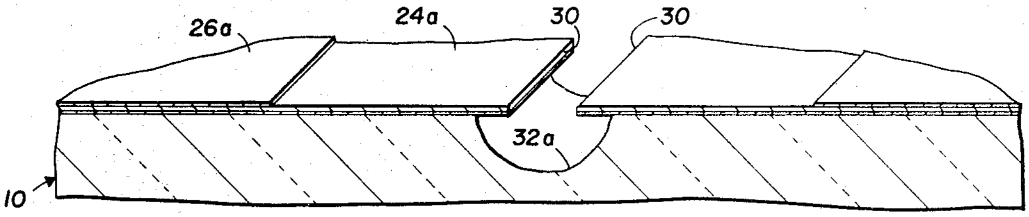
Figure 10:
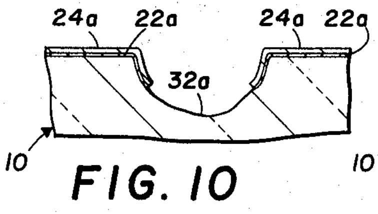
Figure 11:
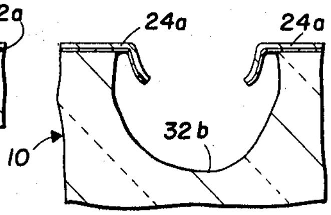
Figure 12:
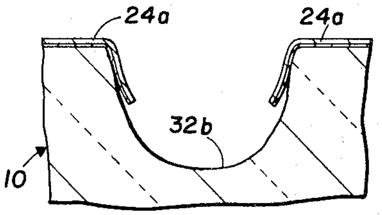
Figure 13:
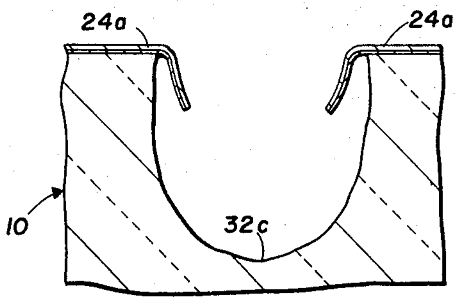
Figure 14:
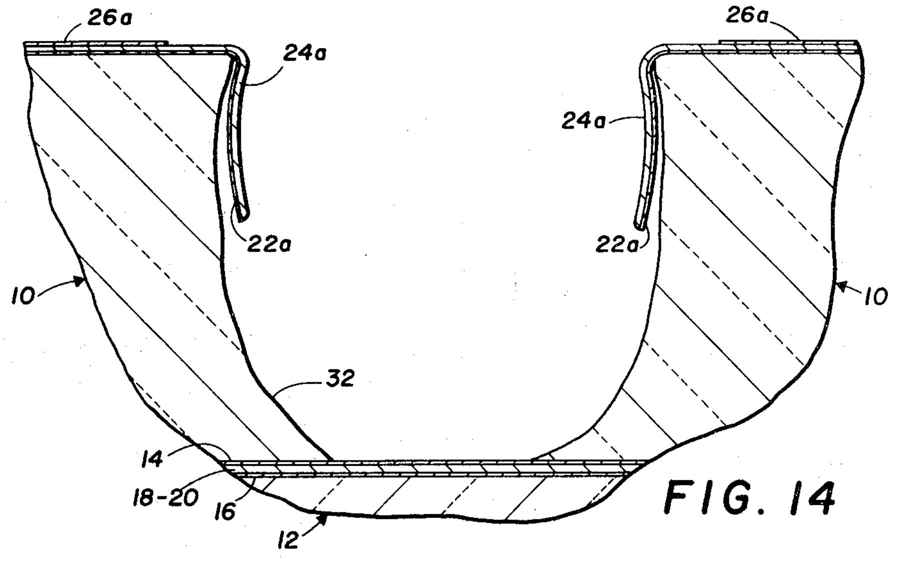
Figure 15:
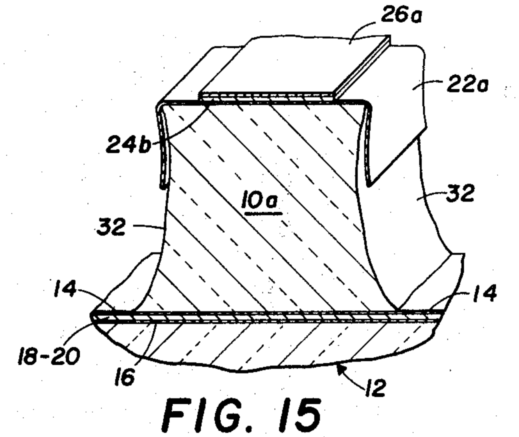

In order to assure uniform etching, the slice 10 is rotated 90° every 10 seconds. Then every 30 seconds, the slice 10 is removed from the etchant stream, held under water, and brushed along the length of the slots 30 using a soft, fine-bristled paint brush. The purpose of the brushing is to bend the portion of the gold strips 24*a* and the underlying chromium layer 22 downwardly into the respective grooves 32*a* etched in the germanium slice and against the walls of the grooves as shown in FIG. 10. The downturned metal layers partially mask the sides of the grooves 32*a* as they are formed, and thus retard etching of the walls of the grooves while permitting unrestricted etching of the bottoms of the grooves. An attempt has been made to illustrate the effects of this procedure in FIGS. 9–15. In general, etching will occur in the lateral direction as well as in the vertical direction, undercutting the overhanging metal layers, unless restricted by the downturned metal mask. FIG. 9 is an attempt to illustrate the cross-sectional configuration of the etched grooves 32 *a* prior to the first brushing. During the brushing cycle of the process, the overhanging edges of the metal strips are bent downwardly against the sides of the etched groove 32*a* substantially as shown in FIG. 10. During the next etching cycle, the etched groove is again deepened to form groove 32*b* somewhat as shown in FIG. 11, and during the subsequent brushing the metal layers 24 and 22 are bent further downwardly along sides of the groove 32*b* to further protect the side walls of the groove as shown in FIG. 12. This sequence is repeated, as shown in FIGS. 13 and 14, until the germanium slice 10 is etched completely through to the chromium layer 14, at which time the etched groove appears somewhat as shown in FIG. 15. The total time required for the etching fluid to etch through the germanium slice 10 is typically about four minutes.

Figure 16:
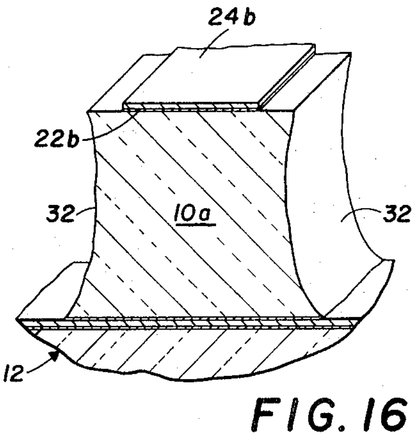
Figure 17:
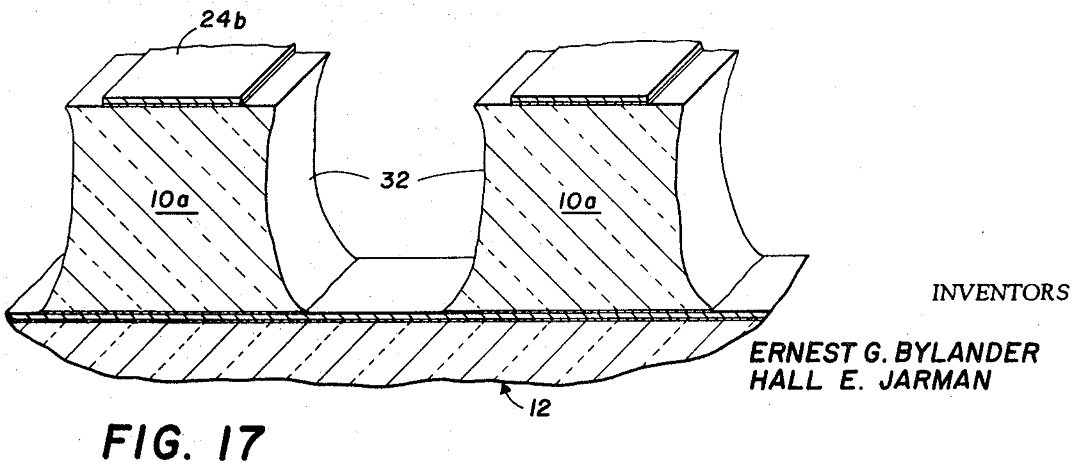

Next, the portion of the gold strip 24*a* that is unprotected by the chromium strips 26*a* is removed using the potassium iodide etching solution, thus leaving gold stips 24*b* substantially as illustrated in FIG. 16. Then the chromium strips 26*a* and the portion of the chromium layer 22 that is unprotected by the remaining gold strips 24*b* are removed using the hydrochloric acid and methyl alcohol etching solution. This leaves the gold strips 24*b* exposed to provide electrical contact with the individual detector bars 10*a*, as illustrated in FIG. 17. The remaining portions of the chromium layer 22 underlying the gold strips 24*b* enhance the mechanical bond between the gold and the detector bars 10*a*.

Figure 18:
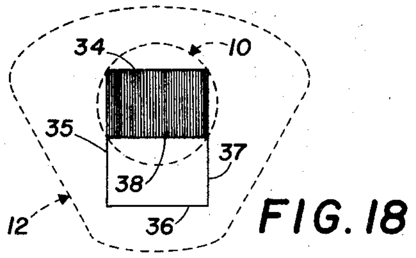
FIG. 18 is a somewhat schematic top view illustrating the manner in which the substrate is cut in order to produce the array in accordance with the present invention.

Next, the slice 10 and substrate 12 are sawed along edges 34, 35, 36, and 37 as illustrated in FIG. 18 to remove excess material. Only the slice 10 is sawed along edge 38 to trim off the ends of the detector elements 10*a*. The edge 34 is then polished using a glass lapping plate and 3,600 grit silicon carbide and water in order to square the ends of the detector elements while avoiding chipping. Only the ends of the detector elements 10*a* at edge 34 are ultimately exposed to the infrared radiation.

During the fabrication process, the degenerate germanium substrate 12 served as a carrier for the slice 10 and ultimately the detectors 10*a*. The degenerate germanium substrate 12, together with the chromium and gold alloying layer, also provides a common electrical terminal and a very good heat sink for all of the detector elements. It will be appreciated that the gold contact strips 24*b* are only about 0.0015 inch wide and that there are about three hundred elements in an array 0.6 inch wide. Thus, connecting each individual detector element 10*a* into the individual amplifier circuit constitutes a substantial problem which is solved in accordance with this invention in manner. following mammer/

Figure 19:
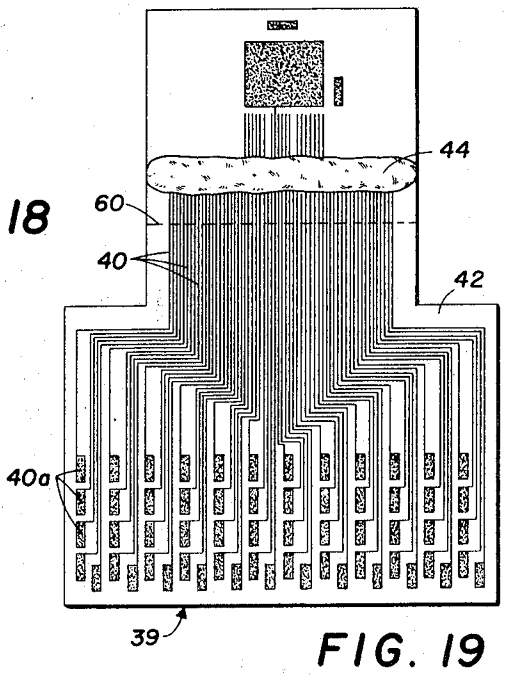
FIG. 19 is a plan view of the lead pattern for a detector array in accordance with this invention.

Referring now to FIG. 19, a printed circuit type sheet in accordance with this invention is indicated generally by the reference numeral 39. The circuit sheet 39 has a very thin, typically 0.0005 inch, flexible, high temperature plastic substrate 42, which is preferably the polypyromellitimide plastic commonly referred to as H-film and sold under the trademark Kapton by DuPont. The H-film is an infusible, nonflammable material with high mechanical stability, excellent electrical properties, and excellent resistance to chemicals, water and abrasion. These properties exist throughout a wide temperature range from liquid helium temperatures to over 400° C. The H-film is presently commercially available with various clad metals. The metals are either thermocompression bonded to the plastic film, or bonded to the film with a binder, such as Teflon. Only the thermocompression bonded stock has been found suitable for this process. In addition, Teflon and irradiated polyethylene film to which metal layers are thermocompression bonded may also be used since these plastics have similar properties, although H-film to which copper foil has been thermocompression bonded is preferred as the starting material for this process.

Figure 20:
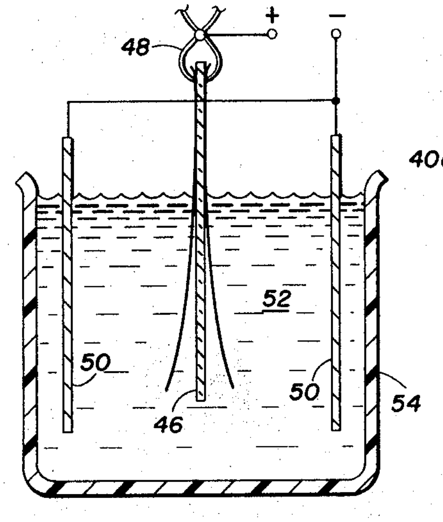
FIG. 20 is a schematic diagram illustrating the gold plating apparatus for the lead pattern of FIG. 19.

The copper foil bonded to the H-film is patterned by conventional photolithographic techniques to form a large number of conductors 40 each of which terminates at an enlarged solder pad 40*a*. Then a silver epoxy shorting bar is painted across the ends of the conductors 40 to facilitate making uniform electrical contact with all of the conductors 40. The conductors 40 are plated with gold using a plating apparatus such as illustrated schematically in FIG. 20. The sheets 39 are clamped on either side of a glass holder plate 46 using a clamp 48 which engages the silver shorting bar 44. The conductors 40 on the H-film sheets 42 form the cathodes of an electro plating system, and gold foil sheets 50 form anodes. The cathodes and anodes are immersed in an acid plating solution 52 in a polyethylene tank 54. The plating solution may be purchased under the trade name Sel-Rex Temperex HD from Sel-Rex Corporation, 75 River Road, Nutley, New Jersey. An a.c. potential is applied across the cathode and anode to produce a negative current flow from the anode to the cathode during one half cycle for plating gold on the copper and a positive current during the other half cycle to repel hydrogen ions and prevent build up of hydrogen bubbles on the plating surface. The positive current is approximately 20 percent of the negative current. The thickness of gold on the copper required to achieve a thermocompression bondable layer has not been measured, but can be determined by a trial and error procedure. In general, if the gold layer is either too thin or too thick, thermocompression bonding cannot be achieved.

Figure 21:
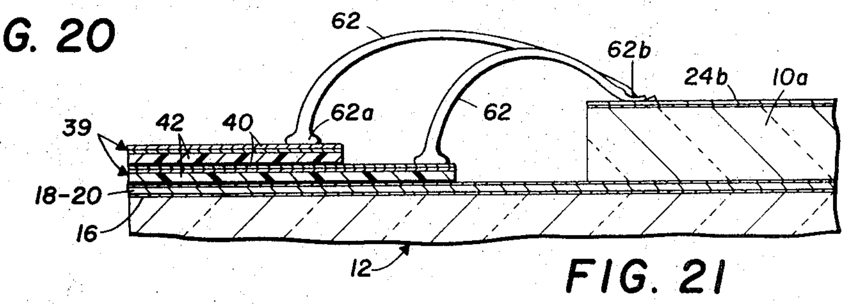
FIG. 21 is a somewhat schematic sectional view illustrating the manner in which the elements of the array are connected to the lead pattern shown in FIG. 19.

After the copper conductors 40 have been gold plated, a portion of the H-film sheet 42 is trimmed away along dotted line 60 to remove the silver shorting bar 44. Each of the circuit sheets 39 typically has only about one-fourth to one-sixth as many conductors as the number of elements 10*a* in an array. For this reason, from four to six circuit sheets 39 may be stacked two or three deep on the top surface of the substrate 12 with the ends disposed adjacent the edge 38 of the array of elements 10a by setting the ends of the upper circuit sheets 39 further back from the edge 38 than the bottom circuit sheets, substantially as shown in FIG. 21. The sheets 39 are bonded in place on the substrate 12 using GE varnish, which is then baked for about one-half hour at about 150° C. Gold jumper wires 62, typically about 0.007 inch in diameter, are then thermocompression bonded to the gold plated conductors 40 and to the gold contact strips 24*b* on the respective detector elements 10*a* using a conventional thermocompression or ball bonding apparatus. For the thermocompression bonding, the substrate 12, and hence all structures associated with the substrate, is heated to a temperature of about 200° C. The capillary feeding the gold wire is typically heated to about 300° C. The capillary feeding the gold wire 62 lowers the end of the wire, which is balled as a result of being previously severed by a flame, against the gold plated conductor 40 and presses the balled end against the conductor to form the first thermocompression bond 62*a*. Then the capillary is moved to the respective contact strip 24*b*, playing out the wire as it is moved, and the edge of the wire is pressed against the respective gold contact strip to make a second thermocompression bond 62*b*. The capillary is then raised upwardly until the wire can be cut by the flame, and the remaining pigtail is removed by tweezers in the conventional manner.

Alternatively, the conductors 40 may be sized and spaced to correspond to the gold contact strips 24b and the gold plated conductors 40 thermocompression bonded directly to the gold contact strips 24*b*. This is achieved by heating the substrate assembly to about 200°–225° C, inverting the sheet 39, and aligning the conductors 40 with the underlying contact strips 24*a*, and then forcing the conductors 40 against the respective contact strips by a heated mandrel to achieve a thermocompression bond. Since the plastic sheet 42 is transparent, alignment of the conductors 40 with the underlying contact strips 24*b* is easily accomplished.

The conductors of the detector array are painted with GE varnish or other insulating material. The detector elements 10*a* are painted black everywhere except at the ends at edge 34 so that the detectors will be sensitive only to infrared radiation passing in through that end. Each detector can then be connected to its respective amplifier circuit by soldering to the respective pad 40*a*.

Figure 22:
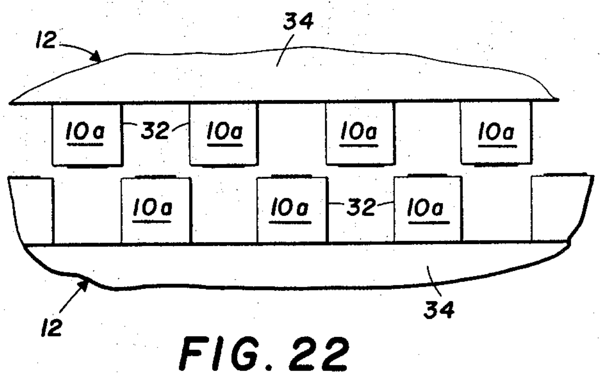
FIG. 22 is an enlarged partial end view illustrating how two or more detector arrays are used in accordance with this invention.

In use, two arrays are then disposed in opposed, staggered relationship, as shown in FIG. 22, to provide a continuous line of detectors for scanning. The signals from the detectors of one subarray may be electronically delayed by the period required for the scan to travel from the detectors of one subarray to the detectors of the other subarray.

The process of the present invention can also be used to fabricate arrays or mosaics of other radiating elements, either detectors or emitters, for detecting or displaying information representations. For example, an array of light emitters may be fabricated using the same process as heretofore described, except that the slice 10 would be a suitable semiconductor material, such as gallium arsenide, indium arsenide, or other group III-group V semiconductor, and a P-N junction would be formed extending parallel to the surfaces of the slice prior to alloying of the slice to the substrate 12. The P-N junction could be formed using any conventional technique, such as by diffusion or by an epitaxial process. In the alternative, the P-N junction for the light emitter could be formed at the time the slice 10 is alloyed to the substrate 12. Thus, a lightly doped gallium arsenide slice 10 could be alloyed to the degenerate germanium substrate 12 using tin, a tin-tellurium alloy, a gold-tellurium alloy, or a gold-zinc alloy, for example. During the alloying process, the impurities would diffuse into the gallium arsenide to form a P-N junction extending parallel to the surface of the slice. The slice could then be divided into elements having the desired shape and the gold contacts 24*b* patterned to provide an opening through which the light would be emitted.

An array of semiconductor lasers of a type known in the art can also be fabricated using the same process. The slice 10 would again be, for example, gallium arsenide appropriately doped with a P-N junction formed in the same manner as described above, either by diffusion, epitaxy or alloying. However, in this case the opposite ends of the elongated elements, which might have the same shape as illustrated in FIG. 18, could be polished or cleaved and made precisely planar and parallel before the slice 10 is alloyed to the substrate 12. The polished ends could be protected during the etching process by a layer of gold. As in all cases, the elements would be coated with an opaque material.

Within the broader aspects of this invention, any degenerate semiconductor substrate having the requisite temperature coefficient of expansion may be used. Also, more than one type of semiconductor may be alloyed to the surface of the substrate because the coefficients of expansion of many semiconductor materials are close to the same values. This provides a means for forming an integrated circuit having components of widely diverse operating parameters available only when different types of semiconductor materials are used for the various components. For example, silicon and most other III–V semiconductors can be alloyed to a degenerate germanium or other semiconductor substrate. The degenerate substrate provides a carrier for a number of different types of semiconductor materials during processing over a wide temperature range, and also provides a mounting for the materials which is a good electrical and thermal conductor.

Although preferred embodiments of the invention have been described in detail, it is to be understood that various changes, substitutions and alterations can be made therein without departing from the spirit and scope of the invention as defined by the appended claims.

What is claimed is:

1. An array of semiconductor elements comprising:

a degenerately doped semiconductor substrate defining a first common electrical contact for said array of elements, said common contact defined by a thin continuous conductive metal layer desposed on a surface of said substrate, a plurality of semiconductor elements disposed adjacent said electrical contact, means for alloying said plurality of elements to said metal layer comprising a continuous relatively thin layer of material having high thermal and electrical conductivity, and means for electrically contacting an exposed surface of each of said elements.

2. The array of elements described in claim 1 wherein the semiconductor elements are mercury doped germanium bars for detecting infrared radiation.

3. The array of elements defined in claim 1 wherein each of said semiconductor elements is doped with impurities to define a P-N junction therein capable of emitting radiation, said P-N junction disposed substantially parallel to said surface of said substrate.

4. The array of elements defined in claim 1 wherein the semiconductor elements are gallium arsenide light emitters.

5. The array defined in claim 1 wherein the semiconductor elements are gallium arsenide lasers.

6. A semiconductor device comprising a degenerately doped substrate of a first semiconductor material and a plurality of semiconductor devices of different semiconductor material bonded to the substrate by an electrically and thermally conductive bonding material, said substrate having a continuous metal layer adjacent said bonding material effective to connect one surface of said plurality of devices in common.

7. The semiconductor device defined in claim 6 wherein the semiconductor devices are bonded to the substrate by a metal alloy.

8. The array of elements defined in claim 1 wherein said alloying means includes a mixture of heat activated bonding materials and conductivity affecting impurities, whereby responsive to application of heat said elements are alloyed to said substrate and said impurities are diffused into said elements.

* * * * *